(12) United States Patent
Van Dyken

(10) Patent No.: US 9,768,784 B2
(45) Date of Patent: Sep. 19, 2017

(54) TRANSFORMABLE LOGIC AND ROUTING STRUCTURES FOR DATAPATH OPTIMIZATION

(71) Applicant: Altera Corporation, San Jose, CA (US)

(72) Inventor: John Curtis Van Dyken, Caledon East (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/008,900

(22) Filed: Jan. 28, 2016

(65) Prior Publication Data

US 2017/0222651 A1 Aug. 3, 2017

(51) Int. Cl.
*H03K 19/177* (2006.01)
*H03K 19/173* (2006.01)

(52) U.S. Cl.
CPC ... *H03K 19/17728* (2013.01); *H03K 19/1737* (2013.01); *H03K 19/1776* (2013.01); *H03K 19/17744* (2013.01)

(58) Field of Classification Search
CPC .............. H03K 19/1737; H03K 19/17728
USPC ...................................... 326/38, 41
See application file for complete search history.

(56) References Cited

U.S. PATENT DOCUMENTS

| | | | |
|---|---|---|---|
| 5,477,165 A | 12/1995 | ElAyat et al. | |
| 6,388,466 B1 * | 5/2002 | Wittig | H03K 19/1736 326/40 |
| 6,653,861 B1 | 11/2003 | Agrawal et al. | |
| 6,998,872 B1 * | 2/2006 | Chirania | H03K 19/1736 326/39 |
| 7,119,575 B1 * | 10/2006 | Schleicher | H03K 19/1737 326/38 |
| 7,800,401 B1 * | 9/2010 | Lewis | H03K 19/177 326/38 |

(Continued)

OTHER PUBLICATIONS

Don Cherepacha et al., "An FPGA Architecture Optimized for Datapaths", VLSI Design, 1996, pp. 329-343, vol. 4, No. 4, Overseas Publishers Association, Amsterdam.

(Continued)

*Primary Examiner* — Don Le
(74) *Attorney, Agent, or Firm* — Treyz Law Group, P.C.; Jason Tsai

(57) ABSTRACT

Integrated circuits such as programmable integrated circuits may include programmable logic regions that can be configured to perform custom user functions. The programmable logic regions may include lookup table (LUT) circuitry driven using vectored multiplexing circuits. The vectored multiplexing circuits may include a first multiplexer stage controlled by common configuration bits, a second multiplexer stage, and means for connecting either outputs of the first multiplexer stage or the output of the second multiplexer stage to corresponding logic circuits. The vectored multiplexing circuits may be used to generate multiple signal variants to vectored lookup table circuitry. The vectored lookup table circuitry may include a first stage of LUTs sharing some number of inputs and a second stage of LUTs at least some of which can be switched out of use. The second stage of LUTs may have inputs that are deactivated in a fractured mode.

19 Claims, 12 Drawing Sheets

(56) References Cited

U.S. PATENT DOCUMENTS

| | | | |
|---|---|---|---|
| 2007/0233767 A1* | 10/2007 | Anderson | G06F 5/015 |
| | | | 708/490 |
| 2011/0228928 A1 | 9/2011 | Trichina | |
| 2013/0257476 A1 | 10/2013 | Cashman et al. | |
| 2013/0278289 A1 | 10/2013 | Jang et al. | |

OTHER PUBLICATIONS

Omesh Mutukuda et al., "The Effect of Multi-bit Based Connections on the Area Efficiency of FPGAs Utilizing Unidirectional Routing Resources", Department of Electrical and Computer Engineering, Ryerson University.

Phoebe Ping Chen et al., "The Effect of Multi-Bit Correlation on the Design of Field-Programmable Gate Array Routing Resources", IEEE Transactions on Very Large Scale Integration (VLSI) Systems, May 8, 2009.

* cited by examiner

US 9,768,784 B2

TRANSFORMABLE LOGIC AND ROUTING STRUCTURES FOR DATAPATH OPTIMIZATION

BACKGROUND

This relates to integrated circuits such as programmable integrated circuits.

Programmable integrated circuits such as programmable logic devices (PLDs) are well known in the art. Programmable integrated circuits can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable integrated circuit memory elements to configure the device to perform the functions of the custom logic circuit. In particular, the configuration data configures programmable interconnects, programmable routing circuits, and programmable logic circuits in the programmable integrated circuits.

Conventional programmable integrated circuits perform routing with full un-biased connectivity, which assumes no relationship between the input signals. High level Hardware Description Language (HDL) such as OpenCL that can be used to program these integrated circuits can, however, be heavily datapath oriented. Conventional programmable integrated circuit do not take advantage of the regularity in datapath heavy designs. Designs having a high percentage of datapath logic are particularly inefficient when compared to a non-programmable implementation. On the other hand, designs with a low percentage of datapath logic exhibit wasted (unused) resources if the target architecture is designed so as to target the datapath regularity (e.g., arithmetic logic units connected with bus-based routing).

It is within this context that the embodiments below arise.

SUMMARY

Programmable integrated circuits with transformable logic and routing structures for datapath optimization are provided. A programmable integrated circuit may include programmable logic blocks each of which can include smaller logic elements. Each logic element may include lookup table circuitry. The lookup table circuitry may be fed using vectored multiplexing circuits.

A vectored multiplexing circuit may include a first multiplexing stage that receives signals from a channel and a second multiplexing stage that is connected to the output of the first multiplexing stage, where the first and second multiplexing stages are configured to simultaneously output multiple channel partitions (e.g., at least a first channel partition and a second channel partition). The first multiplexing stage may have multiplexers that are controlled by shared configuration bits or individually controlled by separate configuration bits. The second multiplexing stage may have fewer multiplexers or the same number of multiplexers as the first multiplexing stage.

The lookup table circuitry may receive the different channel partition signals from one or more vectored multiplexing circuits. The different channel partitions can include at least a first signal variant (i.e., a bit-0 variant) and a second signal variant (i.e., a bit-1 variant). Lookup table circuitry that receives different signal variants is sometimes referred to as vectored lookup table (LUT) circuitry.

The vectored LUT circuitry may include a first LUT stage and a second LUT stage. The first LUT stage may receive a first set of configuration bits and may output a second set of configuration bits to the second LUT stage. The first LUT stage may include multiple two-input LUT circuits, whereas the second LUT stage may include multiple four-input LUT circuits. The first LUT stage may optionally share its inputs. The second LUT stage may also optionally share at least some of its inputs.

The second LUT stage may include multiplexers that can be configured to selectively pass through an active user signal or a ground signal. These multiplexers may be configured to pass through an active user signal to implement a six-input LUT mode or to pass through the ground signal to implement a fractured five-input LUT mode. One or more LUT circuits in the second stage may be selectively switched out of use. Programmable logic circuitry configured in this way can exploit the high degree of regularity across the width of a bus in datapath heavy designs.

Further features of the invention, its nature and various advantages will be more apparent from the accompanying drawings and the following detailed description of the preferred embodiments.

DETAILED DESCRIPTION

The present embodiments relate to integrated circuits including routing circuitry. Examples are described herein in the context of programmable integrated circuits that may include programmable logic, programmable interconnects, and programmable routing circuitry.

Figure 1:
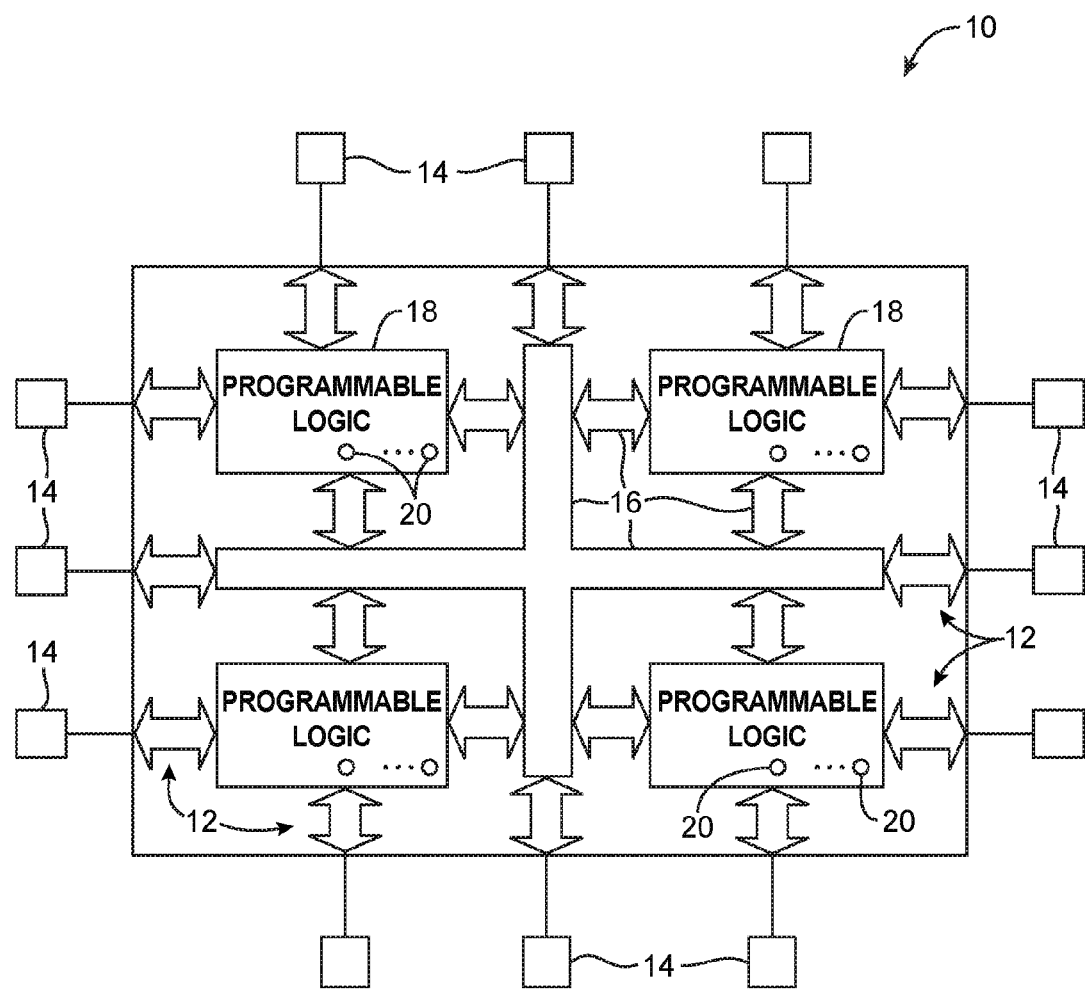
FIG. 1 is a diagram of an illustrative programmable integrated circuit with programmable logic in accordance with an embodiment.

FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18, may, if desired, contain groups of smaller logic regions. These smaller logic regions, which may sometimes be referred to as logic elements or adaptive logic modules, may be interconnected using local interconnection resources.

Programmable logic regions 18 may include combinational and sequential logic circuitry. For example, programmable logic regions 18 may include look-up tables, registers, and multiplexers. Programmable logic regions 18 may be configured to perform one or more custom logic functions.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable elements 20 may be used to provide static control output signals for controlling the state of logic components in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
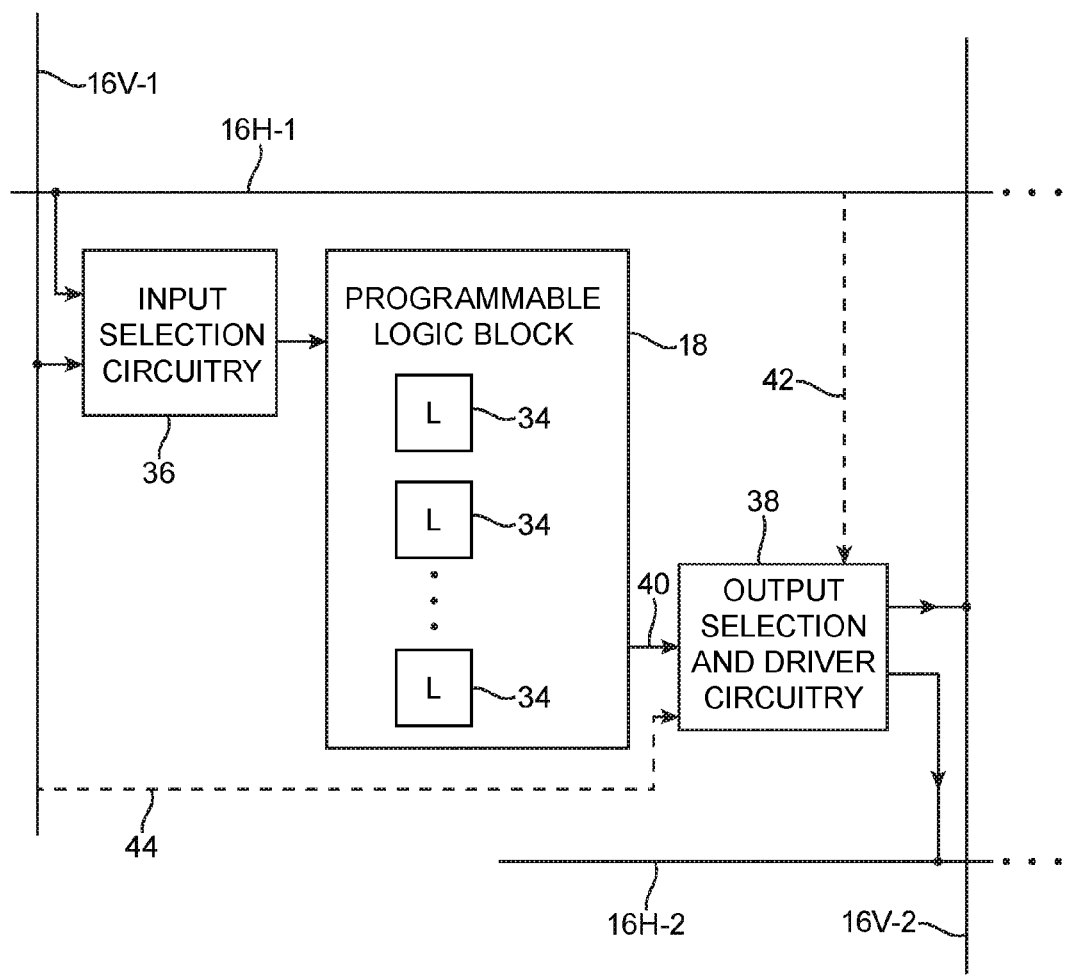
FIG. 2 is a diagram of an illustrative programmable logic block with input selection and output selection circuitry in accordance with an embodiment.

An illustrative programmable logic region 18 including a group of multiple smaller logic regions 34 is shown in FIG. 2. Programmable logic region 18, sometimes referred to as a logic array block (LAB), may have associated input selection circuitry 36 and output selection and driver circuitry 38. Input selection circuitry 36 and output selection and driver circuitry 38 may be formed as part of input-output circuits such as input-output circuits 12 of FIG. 1.

Input selection circuitry 36 may receive input signals via a first set of horizontal interconnects 16H-1 and a first set of vertical interconnects 16V-1. For example, interconnects 16H-1 may provide input signals to programmable logic block 18 from other programmable logic blocks 18 in the same row or from input/output pins 14, whereas interconnects 16V-1 may provide input signals to programmable logic block 18 from other logic blocks 18 in the same column or from pins 14. Input selection circuitry 36 may be configured (e.g., by programming CRAM bits that are associated with input selection circuitry 36) to select one or more of the input signals to provide to programmable logic block 18.

As shown in FIG. 2, programmable logic block 18 may include smaller regions of programmable logic 34. The smaller programmable logic regions 34 within each programmable logic region 18 are sometimes referred to as adaptive logic modules (ALMs) or logic elements (LEs). Logic elements 34 may receive the input signals that are selected by input selection circuitry 36 and may perform custom functions on the input signals to produce output signals. The input signals received by each logic element 34 may overlap with input signal portions received by other logic elements 34 (e.g., some of the input signals received by a first logic region 34 may also be received by a second logic region 34). There may be any suitable number of logic elements 34 within logic block 18.

The output signals may be provided to output selection and driver circuitry 38 via output paths 40. Output selection and driver circuitry 38 may receive output signals via paths 40 and may be configured to provide the output signals to a second set of horizontal interconnects 16H-2 and a second set of vertical interconnects 16V-2.

If desired, output selection circuitry 38 may be configured to disconnect one or more of interconnects 16H-2 or 16V-2 (e.g., by providing no output signal or by providing a high impedance output). If desired, output selection circuitry 38 may be configured to provide a given output signal to multiple interconnects. For example, it may be desirable to route an output signal from a given logic element 34 to two different regions of integrated circuit 10. In this scenario, output selection and driver circuitry 38 may provide that output signal to two different interconnects of different lengths.

In some arrangements, input selection circuitry 36 may include LAB input multiplexers (LIMs) that can be used to select signals from a horizontal channel, a vertical channel, and local outputs from one or more logic elements 34 and to drive a set of LAB lines. The input selection circuitry 36 may also include logic element input multiplexers (LEIMs) that can be used to select signals from some set of LAB lines and to drive the selected signals to logic elements 34. Output selection circuitry 38 may include driver input multiplexers (DIMs) that can be used to select signals from a horizontal channel, a vertical channel, and local outputs from one or more logic elements and to drive wires, which originate in that logic block 18 and route to other logic blocks 18.

Figure 3:
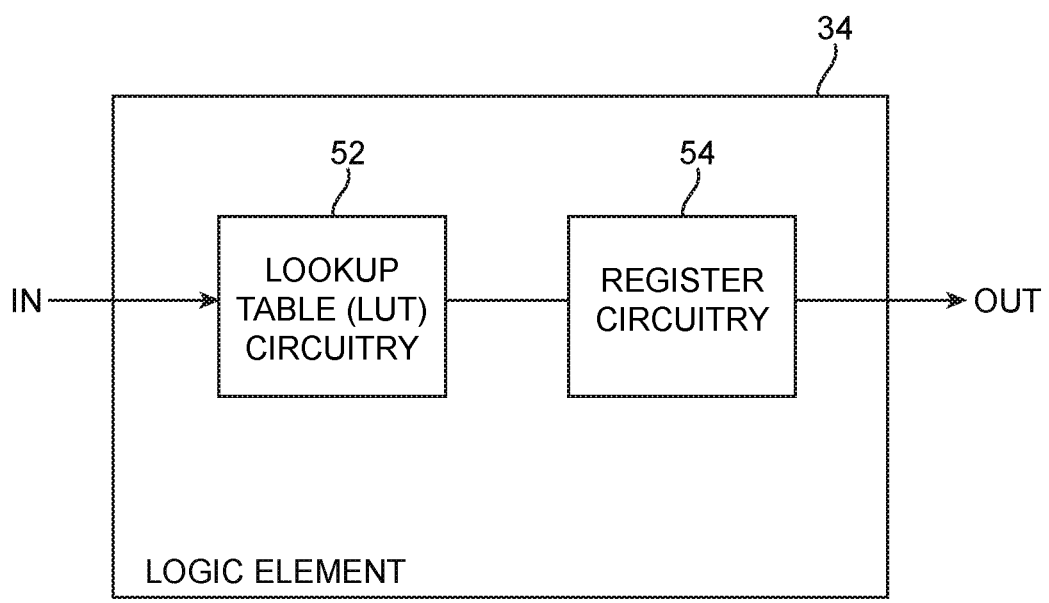
FIG. 3 is a diagram of an illustrative logic element in accordance with an embodiment.

FIG. 3 is an illustrative example of a logic element 34. As shown in FIG. 3, logic element 34 may include lookup table circuitry 52 and register circuitry 54. Lookup table (LUT) circuitry 52 may include look-up tables that process any desired number of inputs. For example, circuitry 52 may include a four-input lookup table (4LUT), a five-input lookup table (5LUT), a six-input lookup table (6LUT), an eight-input lookup table (8LUT), etc. If desired, lookup table circuitry 52 may have multiple configurations each providing a different number of inputs and/or outputs. For example, lookup table circuitry 52 may be a fracturable look-up table having eight inputs. In this scenario, circuitry 52 may have a first configuration in which circuitry 52 forms a 6LUT with one output and a second configuration in which circuitry 52 forms two 5LUTs with two respective outputs. The configuration of circuitry 52 and the logic functions implemented by the look-up tables may be determined based on configuration values stored in programmable elements 20.

Input signals IN may be received by lookup table circuitry 52 (e.g., from input selection circuitry 36 of FIG. 2) and processed based on the configuration of lookup table circuitry 52. Output signals produced by lookup table circuitry 52 may be stored by register circuitry 54 and produced as output signals OUT of logic region 34. If desired, registers in register circuitry 54 may be bypassed using direct paths from lookup table circuitry 52.

Register circuitry 54 may include one or more registers that store output signals from look-up table circuitry 52 based on one or more clock and control signals.

The clock and control signals may be received from interconnects such as interconnects 16 of FIG. 1. If desired, the clock signals may be received from dedicated clock paths (e.g., a global clock tree). Input selection circuitry 36 may be used to select which clock and control signals are provided to register circuitry 54.

Conventional programmable integrated circuits perform routing with full un-biased connectivity, which assumes no relationship between the input signals. High level Hardware Description Language (HDL) such as OpenCL that can be used to program these integrated circuits can, however, be heavily datapath oriented. Datapath heavy designs that typically have a high degree of regularity across the width of the datapath. Thus, architectural efficiency can be improved by exploiting regularity within a set of target implementations.

Figure 4:
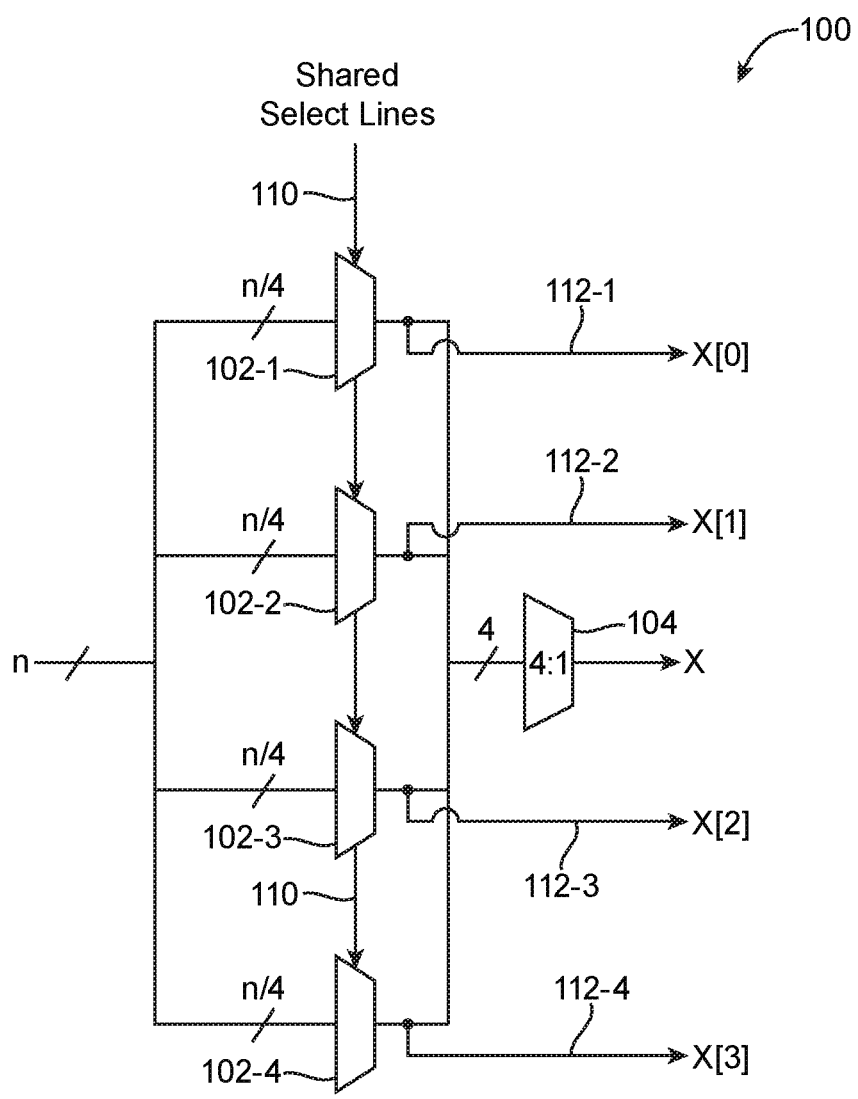
FIG. 4 is a diagram of an illustrative vectored multiplexing circuit in accordance with an embodiment.

In accordance with an embodiment, a vectored multiplexing circuit such as vectored multiplexer 100 is provided that enables extraction of vectored outputs with minimal extra area cost. FIG. 4 shows illustrative vectored multiplexer (VMUX) 100. As shown in FIG. 4, multiplexer 100 may include an input that receives n bits, four input-stage multiplexers 102-1, 102-2 102-3, and 102-4, and an output-stage multiplexer 104. Each of four input-stage multiplexers 102 can receive a quarter (i.e., n/4 bits) of the input bits. The output of each multiplexer 102 can be combined and fed to output-stage multiplexer 104 (e.g., a 4:1 multiplexer). Connected as such, vectored multiplexer 100 has an input that receives an n-input channel and a main output at which signal X is provided.

The n-bit input may represent the total number of bits in a given routing channel. The channel may be split into four channel partitions (as an example). Signals routed through multiplexer 102-1 may be associated with a first channel partition and can be referred to as a "bit-0" partition. Signals routed through multiplexer 102-2 may be associated with a second channel partition and can be referred to as a "bit-1" partition. Signals routed through multiplexer 102-3 may be associated with a third channel partition and can be referred to as a "bit-2" partition. Signals routed through multiplexer 102-4 may be associated with a fourth channel partition and can be referred to as a "bit-3" partition.

Multiplexer 104 that receives bits from each of input-stage stage multiplexer 104 exhibits full connectivity across all four routing partitions. To exploit the high degree of regularity across the width of a particular datapath in datapath heavy logic designs, vectored multiplexer 100 may also be provided with additional partition specific outputs. Still referring to FIG. 4, a first additional output such as first partition output 112-1 on which signal X[0] is provided may be directly coupled to the output of multiplexer 102-1; a second additional output such as second partition output 112-2 on which signal X[1] is provided may be directly coupled to the output of multiplexer 102-2; a third additional output such as third partition output 112-3 on which signal X[2] is provided may be directly coupled to the output of multiplexer 102-3; and a fourth additional output such as fourth partition output 112-4 on which signal X[3] is provided may be directly coupled to the output of multiplexer 102-4.

By tapping directly into the first-stage outputs, additional vectored outputs 112 can be extracted with minimal overhead (e.g., outputs 112 can be simultaneously generated in parallel). In high density logic designs that use fracturable LUTs as an example, the number of modes that can be supported are often limited by the number of inputs available to each LUT. Use of vectored multiplexer 104 to route out multiple partitions in parallel can help solve the issue of insufficient inputs for any set of inputs with regular connectivity.

In the example of FIG. 4, each multiplexer 102 may be controlled using shared select lines 110. This is merely illustrative. If desired, each multiplexer 102 may be controlled individually using separate control lines. As examples, n may be equal to 32, 64, 128, 16, 8, 4, or may represent any suitable integer number of bits. The configuration of FIG. 4 in which vectored multiplexer 100 is divided into four partitions is also exemplary. If desired, vectored multiplexer 100 may be grouped into two or more partitions, three or more partitions, more than four partitions, or eight or more partitions that are simultaneously routed to corresponding logic circuitry.

Figure 5:
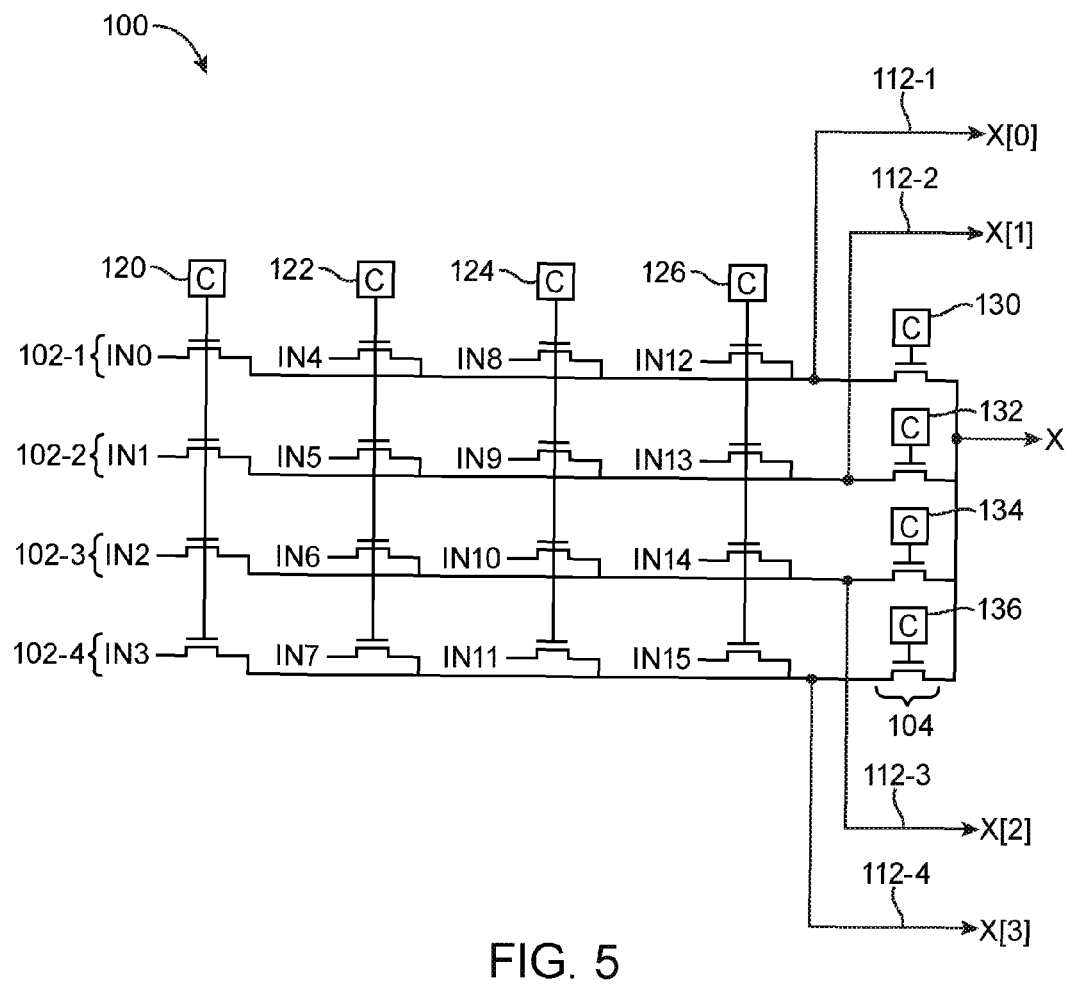
FIG. 5 is a circuit diagram showing one suitable implementation of the vectored multiplexing circuit shown in FIG. 4 in accordance with an embodiment.

FIG. 5 shows one suitable circuit implementation of vectored multiplexer 100. As shown in FIG. 5, first input-stage multiplexer 102-1 may include a first pass transistor that selectively passes through input signal IN0, a second pass transistor that selectively passes through input signal IN4, a third pass transistor that selectively passes through input signal IN8, and a fourth pass transistor that selectively passes through input signal IN12.

Similarly, first input-stage multiplexer 102-2 may include a first pass transistor that selectively passes through input signal IN1, a second pass transistor that selectively passes through input signal IN5, a third pass transistor that selectively passes through input signal IN9, and a fourth pass transistor that selectively passes through input signal IN13.

First input-stage multiplexer 102-3 may include a first pass transistor that selectively passes through input signal IN2, a second pass transistor that selectively passes through input signal IN6, a third pass transistor that selectively passes through input signal IN10, and a fourth pass transistor that selectively passes through input signal IN14.

Lastly, first input-stage multiplexer 102-4 may include a first pass transistor that selectively passes through input signal IN3, a second pass transistor that selectively passes through input signal IN7, a third pass transistor that selectively passes through input signal IN11, and a fourth pass transistor that selectively passes through input signal IN15.

The example of FIG. 5 shows a shared select signal control scheme. The first pass transistor in each multiplexer 102 may be controlled by a first static control bit stored in memory element 120. The second pass transistor in each multiplexer 102 may be controlled by a second static control bit stored in memory element 122. The third pass transistor in each multiplexer 102 may be controlled by a third static control bit stored in memory element 124. The fourth pass transistor in each multiplexer 102 may be controlled by a fourth static control bit stored in memory element 126. This is merely illustrative. In other suitable embodiments, the control signals need not be shared among the four multiplexers 102.

Output-stage multiplexer 104 may have a first pass transistor that is selectively activated by a static control bit stored in memory element 130, a second pass transistor that is selectively activated by a static control bit stored in memory element 132, a third pass transistor that is selectively activated by a static control bit stored in memory element 134, and a fourth pass transistor that is selectively activated by a static control bit stored in memory element 136. Memory elements 120, 122, 124, 126, 130, 132, 134, and 136 as shown in FIG. 5 may be any suitable type of volatile memory circuits (e.g., configuration random-access memory cells) or non-volatile memory circuits (e.g., flash memory or other electrically-programmable read-only memory).

As shown in FIG. 5, first partition output path 112-1 can be coupled directly to the output of multiplexer 102-1 and to the first input of multiplexer 104; second partition output path 112-2 can be coupled directly to the output of multiplexer 102-2 and to the second input of multiplexer 104; third partition output path 112-3 can be coupled directly to the output of multiplexer 102-3 and to the third input of multiplexer 104; and fourth partition output path 112-4 can be coupled directly to the output of multiplexer 102-4 and to the fourth input of multiplexer 104.

The circuit implementation of VMUX 100 as shown in FIG. 5 is merely illustrative and does not serve to limit the scope of the present embodiments. If desired, other suitable ways of implementing vectored multiplexer 100 with additional partition outputs may also be used.

Figure 6:
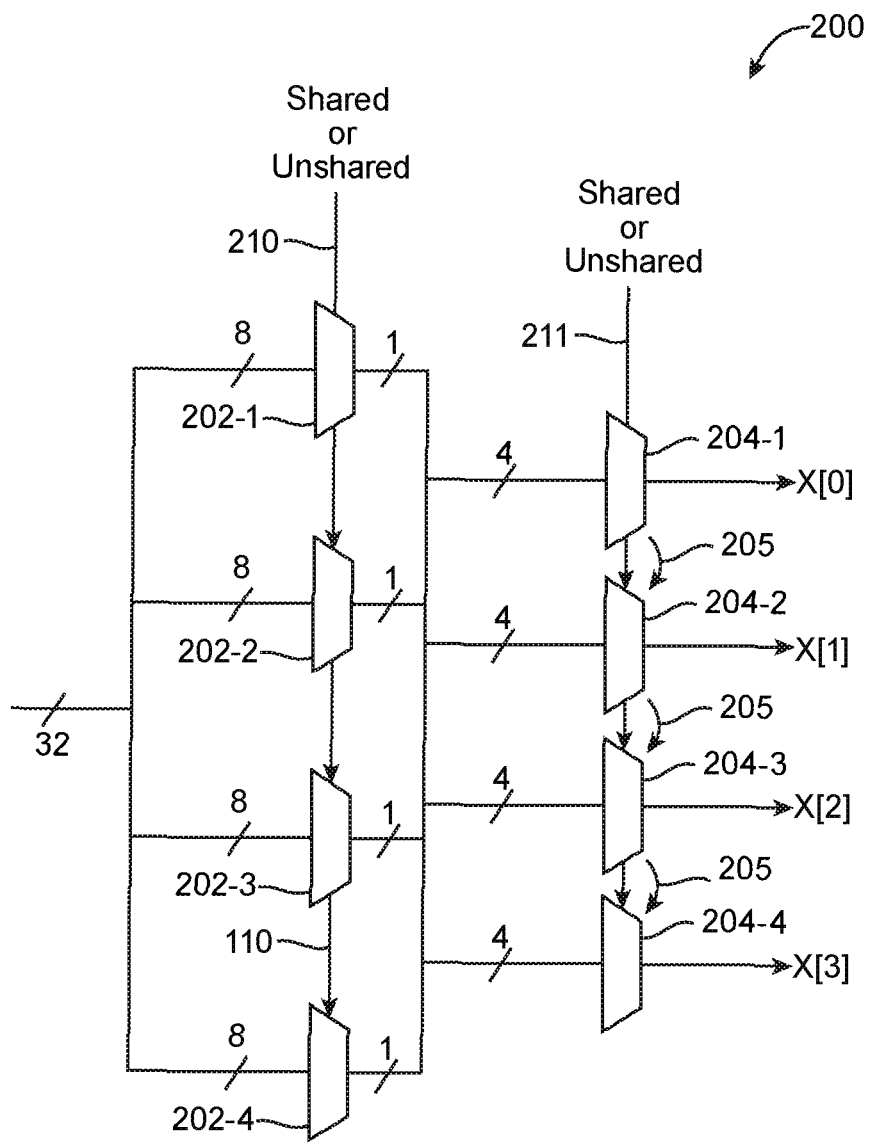
FIG. 6 is a diagram of an illustrative vectored multiplexer with rotate-ability in accordance with an embodiment.

In accordance with another embodiment, it can sometimes be advantageous to provide rotate-ability on the individual VMUX outputs. FIG. 6 shows how the output-stage routing multiplexer can be duplicated to implement the desired rotate-ability. As shown in FIG. 6, rotate-able vectored multiplexer 200 may include four input-stage multiplexers 202 and four output-stage multiplexers 204.

In particular, the example of FIG. 6 illustrates a 32-bit full channel implementation. First multiplexer 202-1 may select signals for a first partition; second multiplexer 202-2 may select signals for a second partition; third multiplexer 202-3 may select signals for a third partition; and fourth multiplexer 202-4 may select signals for a fourth partition. Multiplexers 202 may receive shared or unshared (individual) control signals via control paths 210.

Still referring to FIG. 6, first output-stage multiplexer 204-1 may be used to select and output signals for the first partition; second output-stage multiplexer 204-2 may be used to select and output signals for the second partition; third output-stage multiplexer 204-3 may be used to select and output signals for the third partition; and fourth output-stage multiplexer 204-4 may be used to select and output signals for the fourth partition. As an example, select lines 211 can be shared by twisting between each multiplexer 204 (as indicated by arrows 205). The degree of second stage select sharing can be determined experimentally.

Configured in this way, each multiplexer 204 can have full connectivity to the entire routing channel, but the output signals may be mutually exclusive to one another.

Figure 7:
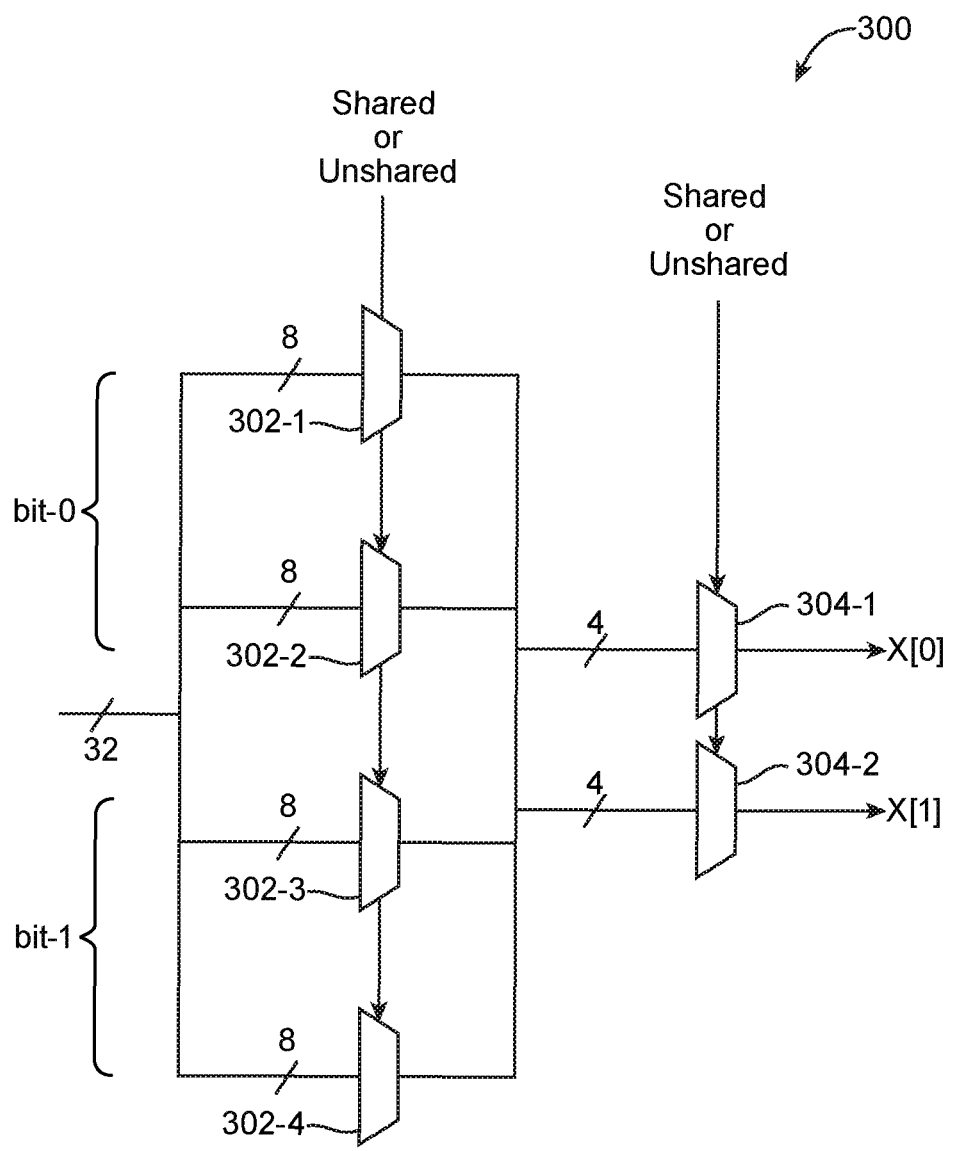
FIG. 7 is a diagram of an illustrative two-way partitioned vectored multiplexer in accordance with an embodiment.

FIG. 7 shows an illustrative two-way partitioned VMUX such as vectored multiplexer 300. As shown in FIG. 7, multiplexer 300 can include four input-stage multiplexers 302 and two output-stage multiplexers 304. Multiplexers 302 may have their control lines shared or unshared. Similarly, multiplexers 304 may have their control lines shared or unshared.

In particular, multiplexers 302-1 and 302-2 may be used for routing signals for a first channel partition (e.g., bit-0 partition) while multiplexers 302-3 and 302-4 may be used for routing signals for a second channel partition (e.g., bit-1 partition). Multiplexer 304-1 may then output a bit-0 version X[0], whereas multiplexer 304-2 outputs a bit-1 version X[1]. Two-way partitioned vectored multiplexer 300 can therefore be used to provide two different versions of an output signal.

There are many ways in which the extra VMUX signals could be used downstream in a programmable logic architecture. For example, any high density LUT architecture that has modes in which inputs are shared can use the different versions of the VMUX outputs. In other words, instead of using identical signals for two different LUTs, a first version (bit-0 partition) of that signal may be used for a first LUT while a second version (bit-1 partition) of that signal may be used for a second LUT. This allows each shared input to be unique for a particular bus index while enabling higher packing densities for bus-based logic designs.

In general, the vectored multiplexers shown in FIGS. 4-7 may be used as a LIM, LEIM, DIM, or any other multiplexing circuit within input selection circuitry 36 and output selection circuitry 38 of FIG. 2.

Figure 8:
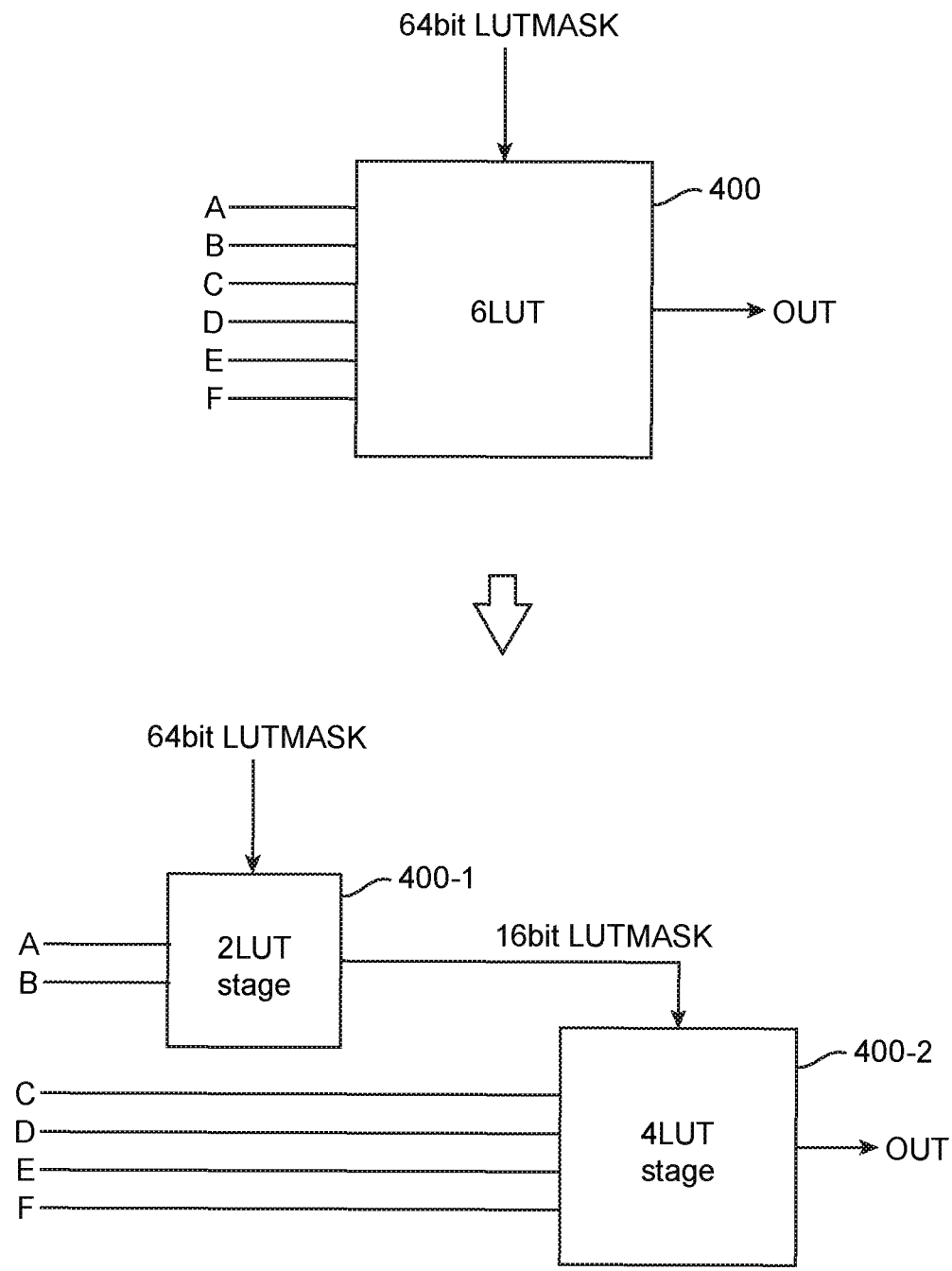
FIG. 8 is a diagram of illustrative two-stage lookup table (LUT) circuitry that can receive input signals from vectored multiplexers in accordance with an embodiment.

FIG. 8 shows lookup table (LUT) circuitry that can receive signals from the vectored multiplexers (e.g., from VMUX 100 shown in FIG. 4, from VMUX 200 shown in FIG. 6, and from VMUX 300 shown in FIG. 7). LUT circuitry 400 may be a six-input lookup table (6LUT) receives six user inputs A, B, C, D, E, and F. LUT circuitry 400 may also receive sixty-four pre-stored configuration bits. The user inputs may be used to index the array of pre-stored configuration bits. The sixty-four pre-stored configuration bits are sometimes referred to collectively as a 64-bit LUT mask.

As shown in FIG. 8, 6LUT circuitry 400 may be implemented as a first two-input LUT (2LUT) stage 400-1 and a second four-input LUT (4LUT) stage 400-2. Stage 400-1 may receive user inputs A and B and also a 64-bit LUT mask. Stage 400-2 may receive remaining user inputs C, D, E, and F and may receive a 16-bit LUT mask from 2LUT stage 400-1. The final output(s) may be provided by 4LUT stage 400-2.

As described above, any user input port that is driven by a vectored multiplexer can have at least two variants (assuming the two-way partitioned example described in connection with FIG. 7): (1) a first "bit-0" variant and (2) and second "bit-1" variant.

Figure 9:
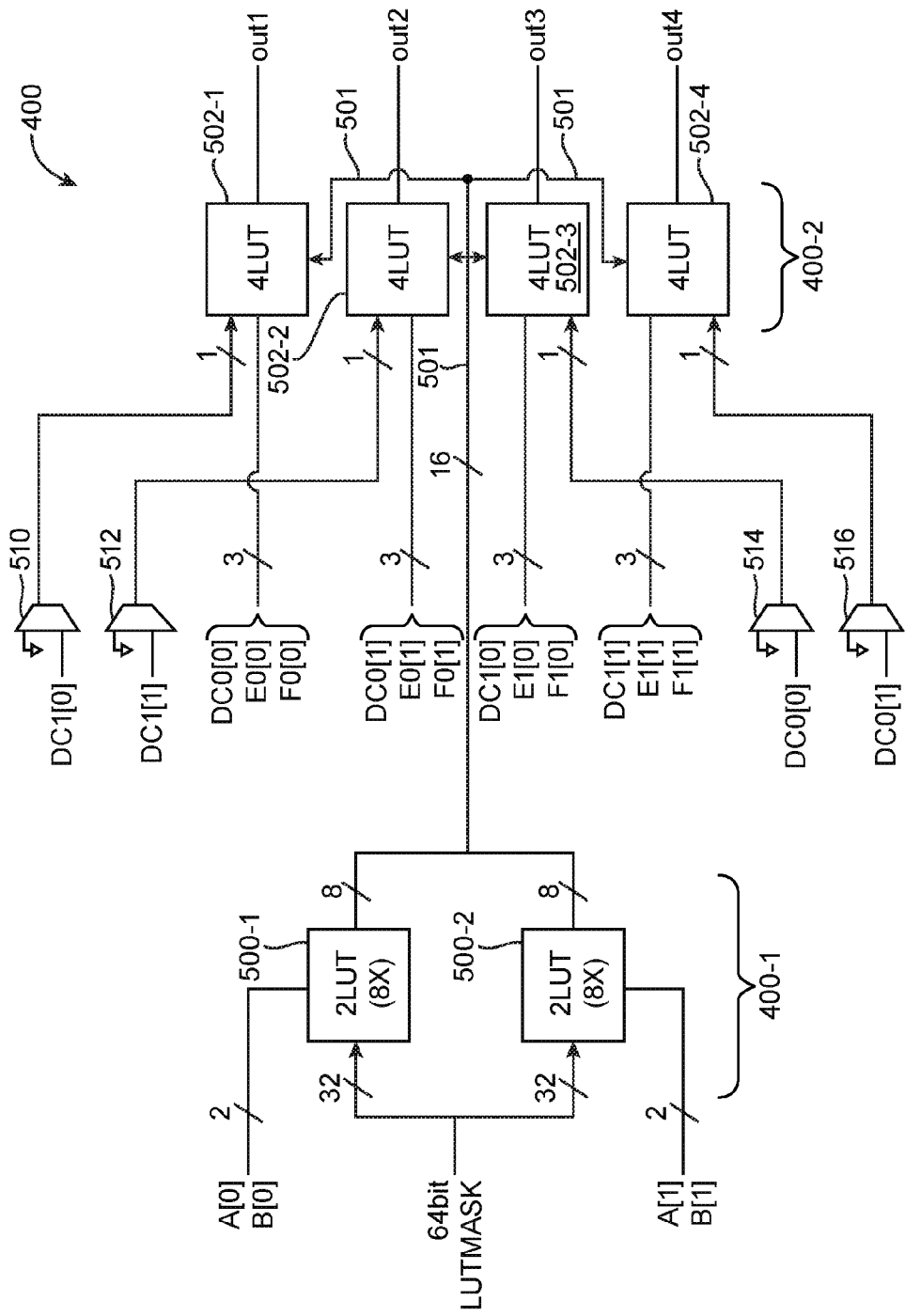
FIG. 9 is a diagram showing one suitable implementation of a vectored LUT in accordance with an embodiment.

FIG. 9 shows one suitable circuit implementation of LUT circuitry 400 that has been optimized to operate in conjunction with vectored multiplexers. In particular, LUT circuitry 400 may be fed by eight vectored multiplexers such as eight two-way partitioned vectored multiplexers 700 of the type shown in FIG. 7. The eight VMUX driven user inputs may include two different versions for each of inputs A, B, DC0, DC1, E0, E1, F0, and F1.

For example, a first VMUX may provide two variants of input A (e.g., input signals A[0] and A[1]). A second VMUX may provide two variants of input B (e.g., input signals B[0] and B[1]). A third VMUX may provide two variants of input DC0 (e.g., input signals DC0[0] and DC0[1]). A fourth VMUX may provide two variants of input DC1 (e.g., input signals DC1[0] and DC1[1]). A fifth VMUX may provide two variants of input E0 (e.g., input signals E0[0] and E0[1]). A sixth VMUX may provide two variants of input E1 (e.g., input signals E1[0] and E1[1]). A seventh VMUX may provide two variants of input F0 (e.g., input signals F0[0] and F0[1]). An eighth VMUX may provide two variants of input F1 (e.g., input signals F1[0] and F1[1]).

FIG. 9 shows how these signals may be received and processed by LUT circuitry 400. As shown in FIG. 9, 2LUT stage 400-1 may include first 2LUT block 500-1 and second 2LUT block 500-1. Each of 2LUT blocks 500-1 and 500-2 may include eight individual two-input lookup tables. Block 500-1 may receive a first halve of the 64-bit LUT mask, whereas block 500-2 can receive a second halve of the 64-bit LUT mask. Each of the eight two-input LUTs in block 500-1 may be addressed using bits A[0] and B[0], whereas each of the eight two-input LUTs in block 500-2 may be addressed using bits A[1] and A[1].

Block 500-1 may output eight corresponding bits depending on the values of A[0] and B[0] while block 500-2 may output eight corresponding bits depending on the values of A[1] and B[1]. The eight bits output from block 500-1 can be combined with the eight bits output from block 500-2 to form a 16-bit LUT mask, which can then be fed to each individual LUT circuit in 4LUT stage 400-2 via path 501. Still referring to FIG. 9, stage 400-2 may include four four-input LUT circuits such as first 4LUT circuit 502-1, second 4LUT circuit 502-2, third 4LUT circuit 502-3, and fourth 4LUT circuit 502-4. Each of these 4-input LUT circuits 502 may receive the 16-bit combined LUT mask from blocks 500-1 and 500-2.

Lookup table 502-1 may have a first input that can receive either signal DC1[0] or a ground voltage via multiplexer 510, a second input that receives signal DC0[0], a third input that receives E0[0], a fourth input that receives F0[0], and an output on which output signal out1 is generated. Lookup table 502-2 may have a first input that can receive either signal DC1[1] or a ground voltage via multiplexer 512, a second input that receives signal DC0[1], a third input that receives E0[1], a fourth input that receives F0[1], and an output on which output signal out2 is generated. Lookup table 502-3 may have a first input that can receive either signal DC0[0] or a ground voltage via multiplexer 514, a second input that receives signal DC1[0], a third input that receives E1[0], a fourth input that receives F1[0], and an output on which output signal out3 is generated. Lookup table 502-4 may have a first input that can receive either signal DC0[1] or a ground voltage via multiplexer 516, a second input that receives signal DC1[1], a third input that receives E1[1], a fourth input that receives F1[1], and an output on which output signal out4 is generated.

Multiplexers 510, 512, 514, and 516 may be used to tie off unused inputs in fractured mode. For example, multiplexer 510 may be configured to route through active user signal DC1[0] when circuitry 400 is operated in a six-input LUT mode or may be configured to route through a ground signal (i.e., zero volts) when circuitry 400 is operated in a fractured five-input LUT mode. Circuitry 400 that is operable in multiple modes with different number of LUT inputs is sometimes referred to as "fracturable" LUT circuitry. Lookup table circuitry 400 that receives multiple variants of input signals from vectored multiplexers are sometimes referred to as vectored lookup tables or VLUTs. By sharing the AB input stage 400-1, fracturable LUT circuitry 400 can provide full input connectivity and support fracturable modes with at least two times the density compared to conventional fracturable LUTs (e.g., there can be at least two and up to four 5LUT or 6LUT outputs generated at any point in time).

Figure 10:
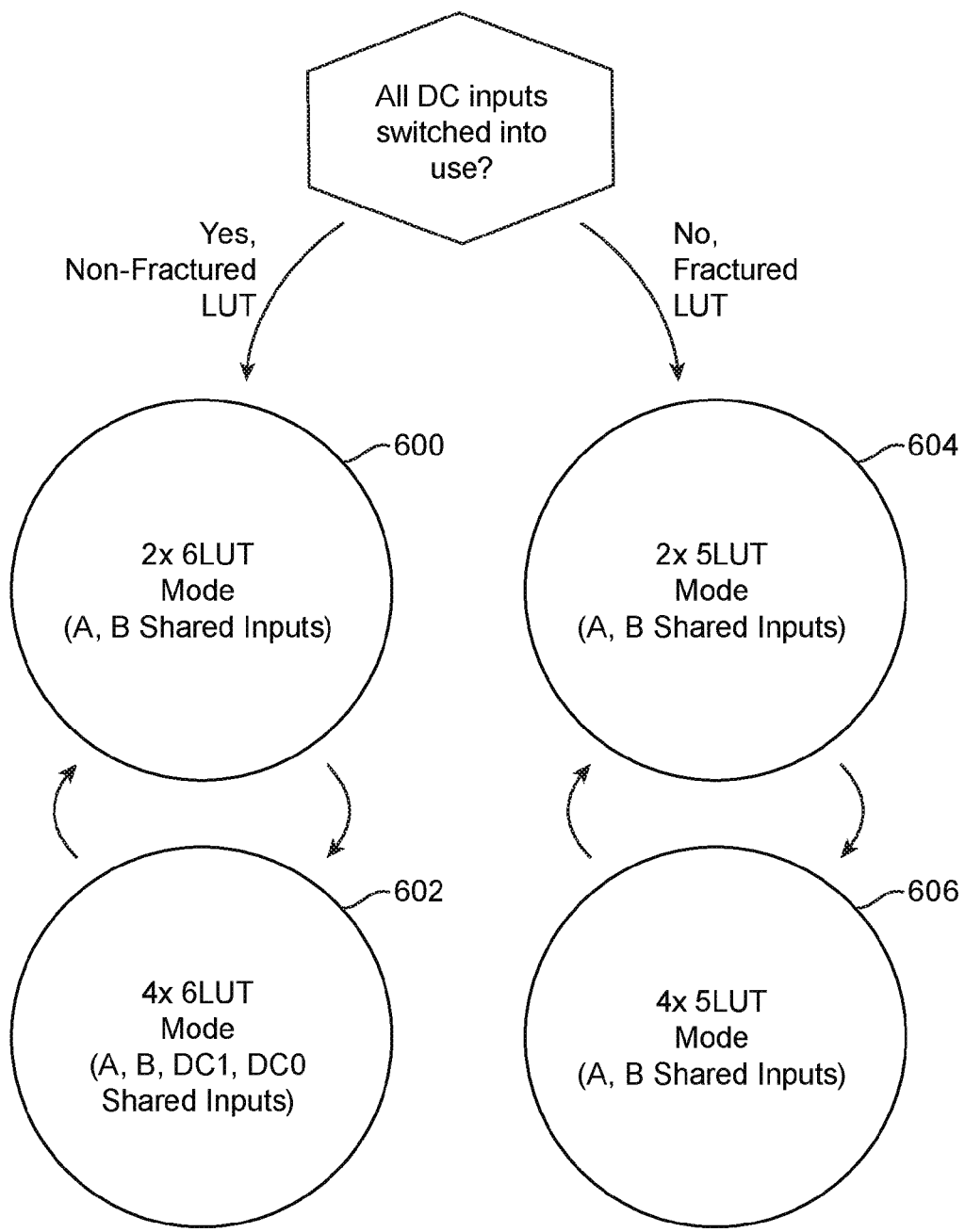
FIG. 10 is a diagram showing illustrative modes of operation in which a vectored LUT of the type shown in FIG. 9 may be operated in accordance with an embodiment.

FIG. 10 is a diagram showing illustrative modes of operation in which a vectored LUT of the type shown in FIG. 9 may be operated. When all the DC inputs (i.e., signals DC0 and DC1 and their variants) are switched into use, circuitry 400 may be operated to support six-input LUT modes. As an example, circuitry 400 may be operated in a 2× 6LUT mode 600 in which two 6LUT outputs are generated using only two of circuits 502 while sharing the AB inputs. As another example, circuitry 400 may be operated in a 4× 6LUT mode 602 in which four 6LUT outputs are generated using all four of circuits 502 while sharing the AB inputs and also the DC0 and DC1 inputs.

When the DC inputs are switched out of use (e.g., by configuring multiplexers 510, 512, 514, and 516 to pass through the grounded input), circuitry 400 may be operated to support five-input LUT modes. As an example, circuitry 400 may be operated in a 2× 5LUT mode 604 in which two 5LUT outputs are generated using only two of circuits 502 while sharing the AB inputs. As another example, circuitry 400 may be operated in a 4× 5LUT mode 606 in which four 5LUT outputs are generated using all four of circuits 502 while sharing the AB inputs.

Figure 11:
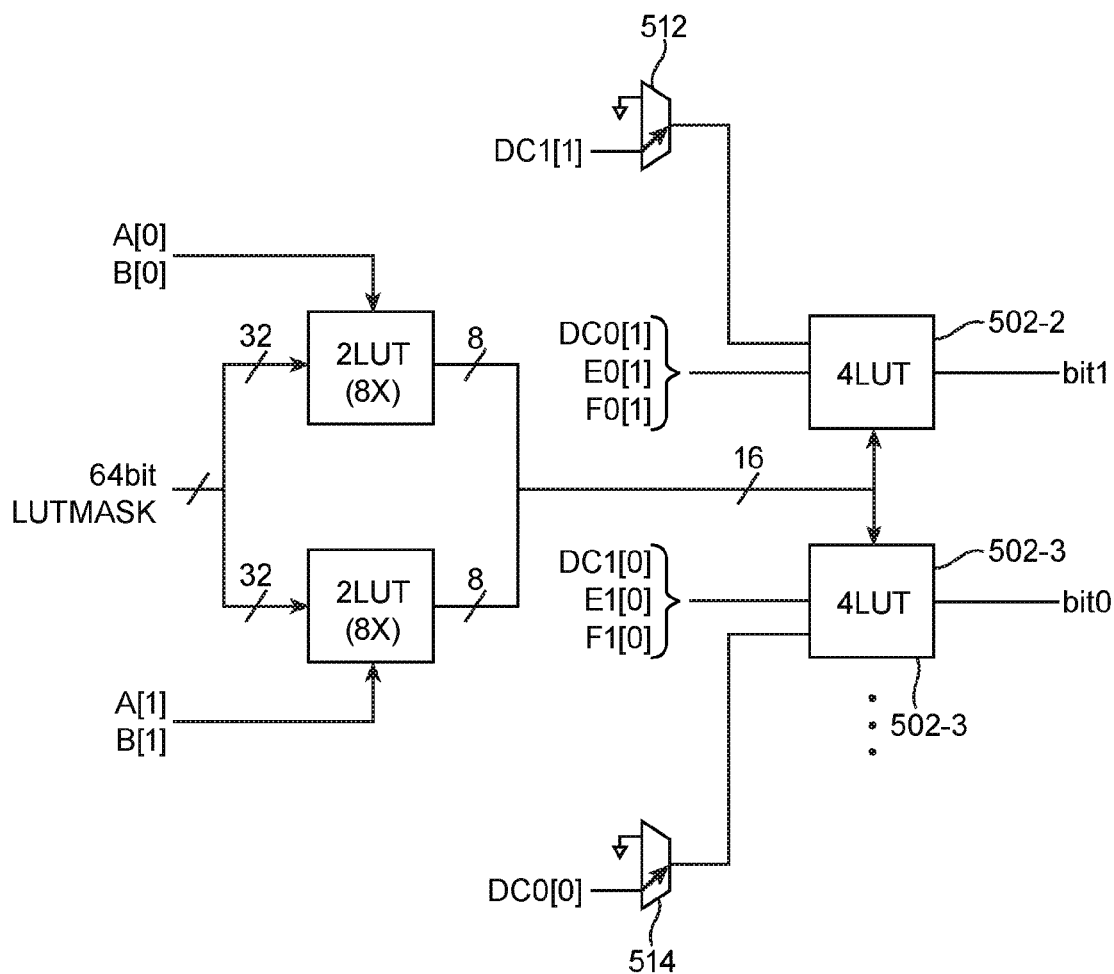
FIG. 11 is a diagram showing how a vectored LUT of the type shown in FIG. 9 can be operated in a 2× six-input LUT mode in accordance with an embodiment.

FIG. 11 is a diagram showing how a vectored LUT of the type shown in FIG. 9 can be operated in 2× six-input LUT mode 600 in accordance with an embodiment. As shown in FIG. 11, only 4LUT circuits 502-2 and 502-3 in stage 400-2 may be switched in use while circuits 502-1 and 502-4 are switched out of use (not shown in FIG. 11 in order to not unnecessarily obscure the present embodiment). In particular, multiplexer 512 may be configured to pass through signal DC1[1] while multiplexer 514 may be configured to pass through signal DC0[0]. Configured in this way, circuit 502-3 may generate a bit0 output that is a function of six user signals A[0], B[0], DC0[0], DC1[0], E1[0], and F1[0], whereas circuit 502-2 may generate a bit1 output that is a function of signals A[1], B[1], DC0[1], DC1[1], E0[1], and F0[1]. In this example, the AB signals may be shared, meaning that signal A[0] is logically equivalent to signal A[1] and that signal B[0] is equal to signal B[1].

In another suitable arrangement, the vectored LUT may also be operated in 4× 6LUT mode 602 (FIG. 10). In mode 602, all four LUT circuits 502 may be switched into use. In particular, multiplexers 510, 512, 514, and 516 may be configured to pass through signals DC1[0], DC1[1], DC0[0], and DC0[1], respectively. Configured in this way, outputs for four different partitions may be generated. In mode 602, signals A, B, DC0, and DC1 may all be shared (e.g., A[0]=A[1]; B[0]=B[1]; DC0 [0]=DC0 [1]; and DC1[0]=DC1[1]).

Figure 12:
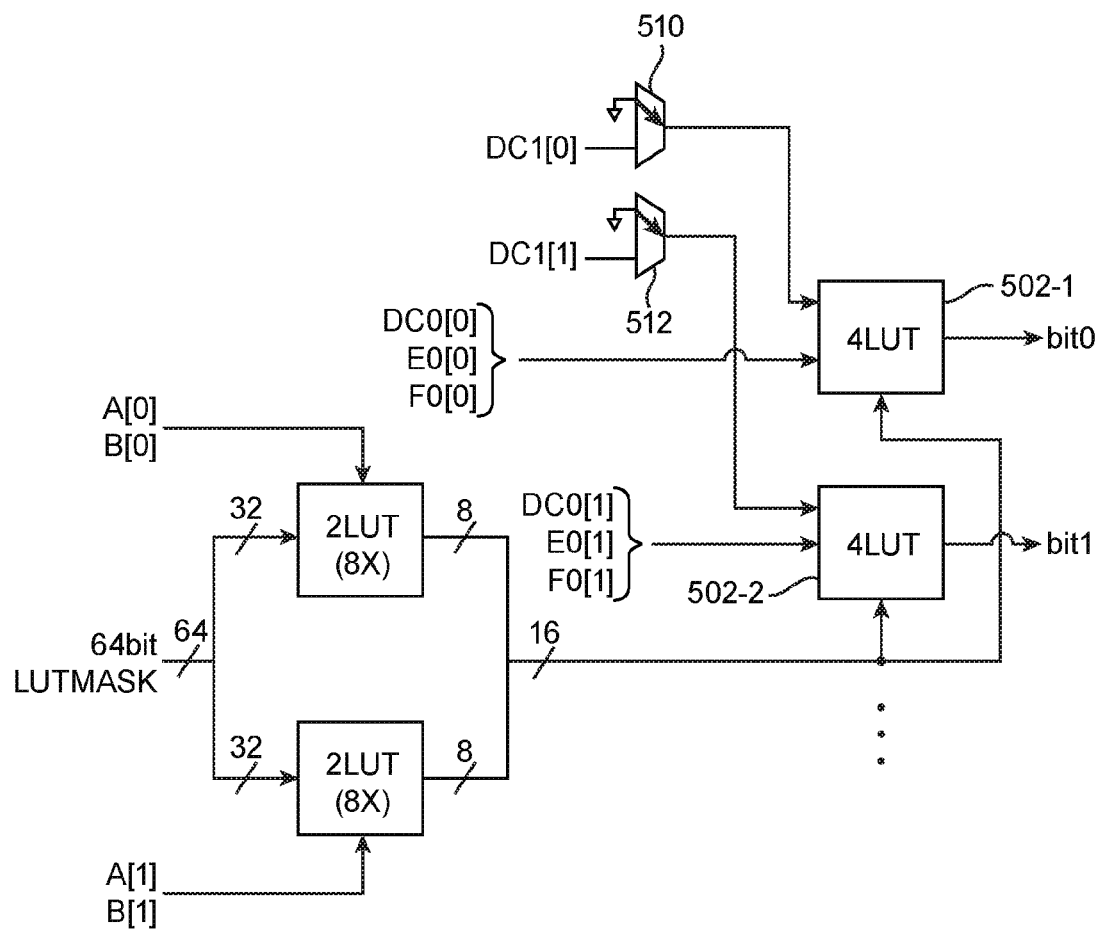
FIG. 12 is a diagram showing how a vectored LUT of the type shown in FIG. 9 may be operated in a 2× five-input LUT mode in accordance with an embodiment.

FIG. 12 is a diagram showing how a vectored LUT of the type shown in FIG. 9 may be operated in 2× five-input LUT mode 604 in accordance with an embodiment. As shown in FIG. 12, only 4LUT circuits 502-1 and 502-2 in stage 400-2 may be switched in use while circuits 502-3 and 502-4 are switched out of use. In particular, the DC1 signals are switched out of use by configuring multiplexers 510 and 512 to pass through the ground signal. Configured in this way, circuit 502-1 may generate a bit0 output that is a function of five user signals A[0], B[0], DC0[0], E0[0], and F0[0], whereas circuit 502-2 may generate a bit1 output that is a function of signals A[1], B[1], DC0[1], E0[1], and F0[1]. In this example, the AB signals may be shared.

In another suitable arrangement, the vectored LUT may also be operated in 4× 5LUT mode 606 (FIG. 10). In mode 606, all four LUT circuits 502 may be switched into use. In particular, multiplexers 510, 512, 514, and 516 may all be configured to pass through the ground signal. Configured in this way, outputs for four different 5LUT partitions may be generated. In mode 606, signals AB may be shared.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IC circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
  logic circuitry; and
  a vectored multiplexing circuit that receives signals from a channel and that includes:
    a first output;
    a second output;
    a third output;
    a first multiplexing stage; and
    a second multiplexing stage that is coupled in series with the first multiplexing stage and that drives the third output, wherein the first and second multiplexing stages are configured to simultaneously route to the logic circuitry a first partition of the channel via the first output and a second partition of the channel that is different than the first partition via the second output, and wherein the first and second multiplexing stages are further configured to route third and fourth partitions of the channel to the logic circuitry.

2. The integrated circuit of claim 1, further comprising:
  memory elements that store configuration bits that are shared among each multiplexer in the first multiplexing stage.

3. The integrated circuit of claim 1, further comprising:
  memory elements that store configuration bits that separately control respective multiplexers in the first multiplexing stage.

4. The integrated circuit of claim 1, wherein the second multiplexing stage includes only one multiplexer.

5. The integrated circuit of claim 1, wherein the second multiplexing stage includes two multiplexers.

6. The integrated circuit of claim 1, wherein the second multiplexing stage includes four multiplexers.

7. The integrated circuit of claim 1, wherein the logic circuitry comprises lookup table circuitry that receives the first and second partitions of the channel from the vectored multiplexing circuit.

8. An integrated circuit, comprising:
  driver circuitry that generates an input signal of first and second variants; and
  vectored lookup table circuitry that includes:
    a first lookup table (LUT) stage; and
    a second lookup table (LUT) stage connected in series with the first LUT stage, wherein the first LUT stage receives the input signal of the first and second variants from the driver circuitry in parallel.

9. The integrated circuit of claim 8, wherein the driver circuitry comprises a vectored multiplexing circuit that receives signals from a channel and that outputs a first channel partition that represents the first variant of the input signal and a second channel partition that represents the second variant of the input signal.

10. The integrated circuit of claim 8, wherein the first LUT stage includes lookup tables each having a first number of inputs, and wherein the second LUT stage includes lookup tables each having a second number of inputs that is greater than the first number of inputs.

11. The integrated circuit of claim 8, further comprising:
  a plurality of memory elements that provides a first set of configuration data bits to the first LUT stage, wherein the first LUT stage provides a second set of configuration data bits to the second LUT stage.

12. The integrated circuit of claim 8, wherein the second LUT stage comprises:
  a first LUT circuit;
  a second LUT circuit;
  a first multiplexer that selectively passes a ground voltage to the first LUT circuit; and
  a second multiplexer that selectively passes the ground voltage to the second LUT circuit.

13. The integrated circuit of claim 8, wherein lookup table circuits in the first LUT stage share input signals.

14. The integrated circuit of claim 8, wherein lookup table circuits in the second LUT stage share input signals.

15. An integrated circuit, comprising:
  a vectored multiplexer that receives signals from a channel and that simultaneously outputs a first channel partition and a second channel partition that is different than the first channel partition; and
  vectored lookup table circuitry that receives the first channel partition and the second channel partition from the vectored multiplexer and that is operable in a first mode that is a function of a first number of user inputs and a second mode that is a function of a second number of user inputs that is different than the first number of user inputs.

16. The integrated circuit of claim 15, wherein the vectored multiplexer includes a first multiplexer stage and a second multiplexer stage coupled to an output of the first multiplexer stage.

17. The integrated circuit of claim 16, wherein the second multiplexer stages includes at least two multiplexers.

18. The integrated circuit of claim 15, wherein the vectored lookup table circuitry includes a first lookup table (LUT) stage and a second lookup table (LUT) stage coupled to an output of the first LUT stage.

19. The integrated circuit of claim 18, wherein the second LUT stage includes lookup tables that are selectively switched out of use.

* * * * *